(12) United States Patent
Yeh et al.

(10) Patent No.: US 9,099,861 B2
(45) Date of Patent: Aug. 4, 2015

(54) OVER-VOLTAGE PROTECTION DEVICE AND METHOD FOR PREPARING THE SAME

(71) Applicant: INPAQ TECHNOLOGY CO., LTD., Miaoli (TW)

(72) Inventors: Hsiu Lun Yeh, Taoyuan County (TW); Yu Chia Chang, Taichung (TW); Tze Chun Liu, Miaoli County (TW); Hsiu Mei Hsu, Miaoli County (TW)

(73) Assignee: INPAQ TECHNOLOGY CO., LTD., Miaoli (TW)

( * ) Notice: Subject to any disclaimer, the term of this patent is extended or adjusted under 35 U.S.C. 154(b) by 149 days.

(21) Appl. No.: 13/900,824

(22) Filed: May 23, 2013

(65) Prior Publication Data
US 2014/0347772 A1    Nov. 27, 2014

(51) Int. Cl.
*H02H 9/04*    (2006.01)

(52) U.S. Cl.
CPC .................... *H02H 9/044* (2013.01)

(58) Field of Classification Search
USPC ............................................. 361/56, 57, 112
See application file for complete search history.

(56) References Cited

U.S. PATENT DOCUMENTS

| | | | | |
|---|---|---|---|---|
| 4,322,777 A * | 3/1982 | Ueta et al. | ...................... | 361/748 |
| 4,804,490 A * | 2/1989 | Pryor et al. | ...................... | 438/796 |
| 4,809,044 A * | 2/1989 | Pryor et al. | ........................ | 257/3 |
| 5,245,502 A * | 9/1993 | Genovese | ...................... | 361/225 |
| 5,838,337 A * | 11/1998 | Kimura et al. | ................. | 345/519 |
| 6,411,494 B1 * | 6/2002 | Watt | ........................... | 361/306.3 |
| 7,897,497 B2 * | 3/2011 | Kamii et al. | ................... | 438/545 |
| 8,222,659 B2 * | 7/2012 | Tomoda | ......................... | 257/98 |
| 2002/0135310 A1 * | 9/2002 | Amano | ...................... | 315/169.3 |
| 2003/0071245 A1 * | 4/2003 | Harris | ........................... | 252/500 |
| 2004/0046242 A1 * | 3/2004 | Asakawa | ...................... | 257/678 |
| 2005/0168899 A1 * | 8/2005 | Sato et al. | .................... | 361/91.1 |
| 2005/0271107 A1 * | 12/2005 | Murakami et al. | ........... | 372/50.1 |
| 2006/0061925 A1 * | 3/2006 | Shrier | ............................ | 361/56 |
| 2007/0285866 A1 * | 12/2007 | Ueda et al. | .................... | 361/120 |
| 2008/0079533 A1 * | 4/2008 | Liu et al. | ......................... | 338/21 |
| 2010/0025675 A1 * | 2/2010 | Yamazaki et al. | .............. | 257/43 |
| 2010/0134235 A1 * | 6/2010 | Yoshioka et al. | .............. | 338/21 |
| 2011/0006672 A1 * | 1/2011 | Kim et al. | .................... | 313/509 |
| 2011/0260171 A1 * | 10/2011 | Yamazaki | ....................... | 257/60 |
| 2011/0263091 A1 * | 10/2011 | Yamazaki | ..................... | 438/287 |
| 2011/0316086 A1 * | 12/2011 | Hauenstein | ................... | 257/368 |
| 2013/0083440 A1 * | 4/2013 | Nozoe et al. | ................... | 361/56 |

\* cited by examiner

*Primary Examiner* — Thienvu Tran
*Assistant Examiner* — Angela Brooks
(74) *Attorney, Agent, or Firm* — WPAT, P.C.; Anthony King; Kay Yang

(57) ABSTRACT

An over-voltage protection device includes a substrate, an insulation layer having a depression over the substrate, a conductor layer having a first electrode and a second electrode over the insulation layer, wherein the first electrode and the second electrode form a discharge path, and the depression is under the discharge path. A method for preparing the over-voltage protection device includes the steps of forming an insulation layer over a substrate; forming a depression in the insulation layer; forming a photoresist pattern filling the depression and protruding the insulation layer; forming a conductor layer over the insulation layer; and removing the photoresist pattern, wherein the photoresist pattern divides the conductor layer into a first electrode and a second electrode that form a discharge path, and the depression is under the discharge path after the removal of the photoresist pattern.

11 Claims, 10 Drawing Sheets

OVER-VOLTAGE PROTECTION DEVICE AND METHOD FOR PREPARING THE SAME

TECHNICAL FIELD

The present disclosure relates to an over-voltage protection device and method for preparing the same, and more particularly, to an over-voltage protection device utilizing an air discharge technique and method for preparing the same.

DISCUSSION OF THE BACKGROUND

Abnormal voltages or electrostatic discharges (ESD) occurring in electronic circuit operations have the potential to severely damage electronic devices. To avoid such damage, it is typical to equip an over-voltage protection device to prevent the electronic devices from being influenced by the abnormal voltages or electrostatic discharges.

In current electronic products, the size of the electronic devices shrinks as the fabrication techniques advance, and as a result, the risk of damage by electrostatic discharge becomes more likely to occur. In addition, rapidly changing portable mobile electronics have an ever-increasing demand for electrostatic discharge protection. There are many electrostatic discharge protection techniques that are used to solve the above issues, and of these techniques, air discharge is the most frequently used.

However, the conventional air discharge technique is commonly implemented by forming electrodes on the substrate, which may generate a leakage problem and decrease the performance of the electrostatic discharge protection device.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides an over-voltage is protection device utilizing an air discharge technique and method for preparing the same.

An over-voltage protection device, according to this aspect of the present disclosure, comprises a substrate; an insulation layer disposed over the substrate, wherein the insulation layer has a depression over the substrate; and a conductor layer disposed over the insulation layer, wherein the conductor layer has a first electrode and a second electrode over the insulation layer, the first electrode and the second electrode form a discharge path, and the depression is under the discharge path.

An over-voltage protection device, according to another aspect of the present disclosure, comprises an insulation substrate having a depression and a conductor layer disposed over the insulation substrate, wherein the conductor layer has a first electrode and a second electrode over the insulation layer, the first electrode and the second electrode form a discharge path, and the depression is under the discharge path.

A method for preparing an over-voltage protection device, according to this aspect of the present disclosure, comprises steps of forming an insulation layer over a substrate; forming a depression in the insulation layer; forming a photoresist pattern filling the depression and protruding the insulation layer; forming a conductor layer over the insulation substrate, wherein the photoresist pattern separates the conductor layer to form a first electrode and a second electrode; and removing the photoresist pattern to form a discharge path between the first electrode and the second electrode with the depression being under the discharge path.

A method for preparing an over-voltage protection device, according to another aspect of the present disclosure, comprises steps of forming a depression in an insulation substrate; forming a photoresist pattern filling the depression and protruding the insulation layer; forming a conductor layer over the insulation substrate, wherein the photoresist pattern separates the conductor layer to form a first electrode and a second electrode; and removing the photoresist pattern to form a discharge path between the first electrode and the second electrode with the depression being under the discharge path.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to an over-voltage protection device utilizing an air discharge technique and method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
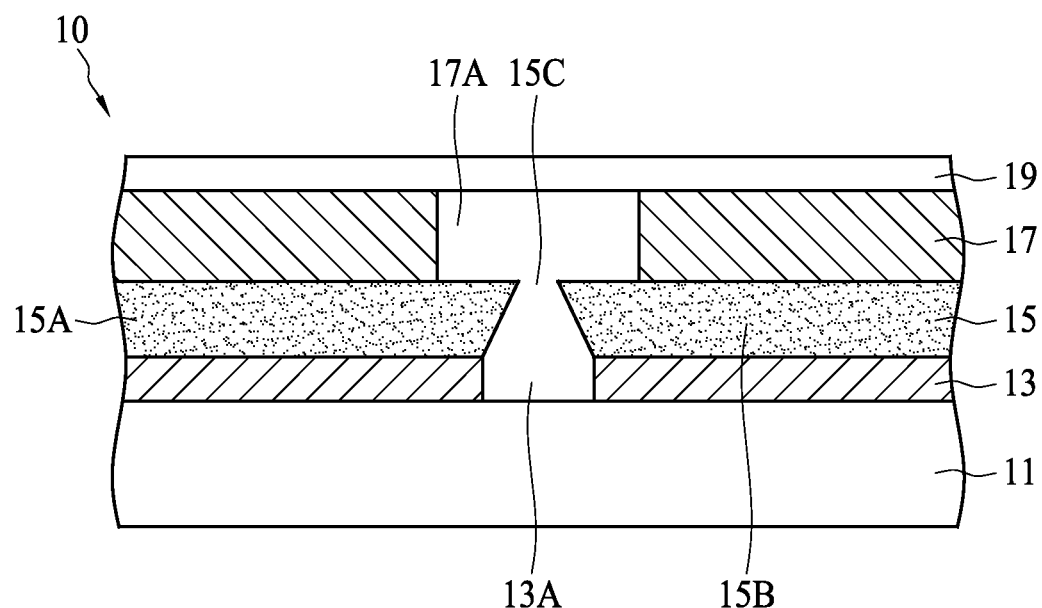
FIG. 1 is a cross-sectional view illustrating an over-voltage protection device according to one embodiment of the present invention.
Figure 2:
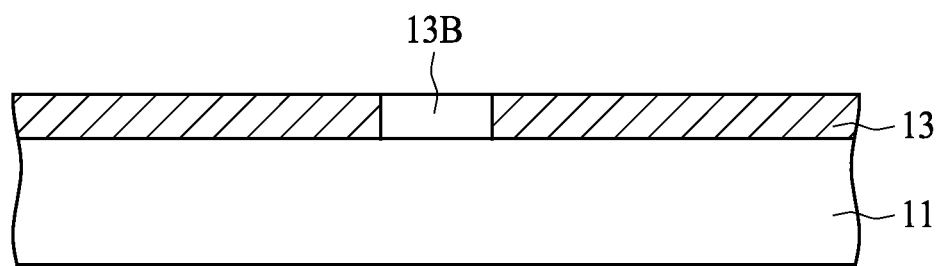
FIG. 2 to FIG. 10 are schematic views illustrating a method for preparing the over-voltage protection device shown in FIG. 1 according to one embodiment of the present invention.

FIG. 1 is a cross-sectional view illustrating an over-voltage protection device 10 according to one embodiment of the present invention. In one embodiment of the present invention, the over-voltage protection device 10 comprises a substrate 11, an insulation layer 13 disposed over the substrate 11, a conductor layer 15 disposed over the insulation layer 13, a gasket layer 17 disposed over the conductor layer 15, and a protection layer 19 disposed over the gasket layer 17. In the embodiment, the insulation layer 13 has a depression 13A; the conductor layer 15 has a first electrode 15A and a second electrode 15B, wherein the first electrode 15A and the second electrode 15B form a discharge path 15C, and the depression 13A is under the discharge path 15C, the gasket layer 17 has an opening 17A exposing at least a portion of the first electrode 15A and the second electrode 15B, and the protection layer 19 shields the opening 17A.

In the embodiment, a cross-sectional width of the opening 17A is larger than a cross-sectional width of the depression 13A; the first electrode 15A has a first tip, the second electrode 15B has a second tip facing the first tip, and the first tip and the second tip are disposed over the depression 13A. Consequently, when a high voltage is applied to the first tip and the second tip, an air discharge, similar to an arc discharge, occurs between the first tip and the second tip, wherein electrode pieces may be generated from the first tip and the second tip by the air discharge. The depression 13A can receive the electrode pieces generated during the air discharge so as to avoid the accumulation of the electrode pieces, which may cause a short circuit between the first tip and the second tip. As a result, the performance of the over-voltage protection device 10 can be ensured.

In one embodiment of the present disclosure, the substrate 11 comprises aluminum oxide or ceramic, the insulation layer 13 comprises polyimide, the conductor layer 15 comprises copper, the gasket layer 17 comprises epoxy resin or polyimide, and the protection layer 19 comprises epoxy resin or polyimide. In one embodiment of the present disclosure, the over-voltage protection device 10 is equipped with the protection layer 19 to isolate the conductor layer 15 from the external environment so as to prevent an external material from falling into the space between the first tip and the second tip, which may cause a short circuit between the first tip and the second tip. In one embodiment of the present disclosure, the gasket layer 17 separates the protection layer 19 from the conductor layer 15; in addition, the opening 17A provides additional space, which allows the first tip and the second tip to conduct the air discharge through the additional space.

Figure 3:
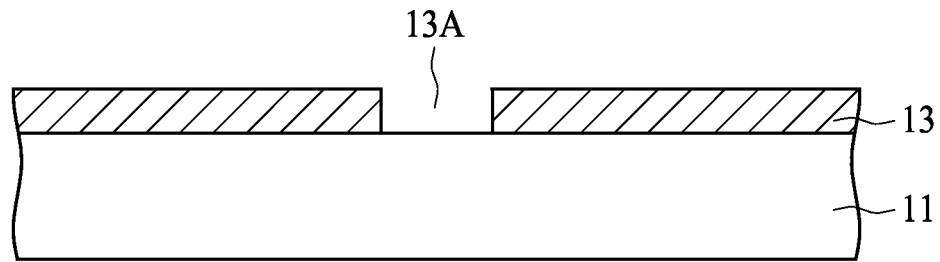

FIG. 2 to FIG. 10 are schematic views illustrating a method for preparing the over-voltage protection device 10 shown in FIG. 1 according to one embodiment of the present invention. In one embodiment of the present disclosure, referring to FIG. 2, an insulation layer 13 comprising photosensitive polyimide is formed over a substrate 11 comprising aluminum oxide or ceramic. An exposure process is then performed on a predetermined portion 13B of the insulation layer 13, and the predetermined portion 13B is removed by a developing process to form a depression 13A in the insulation layer 13, as shown in FIG. 3.

Figure 4:
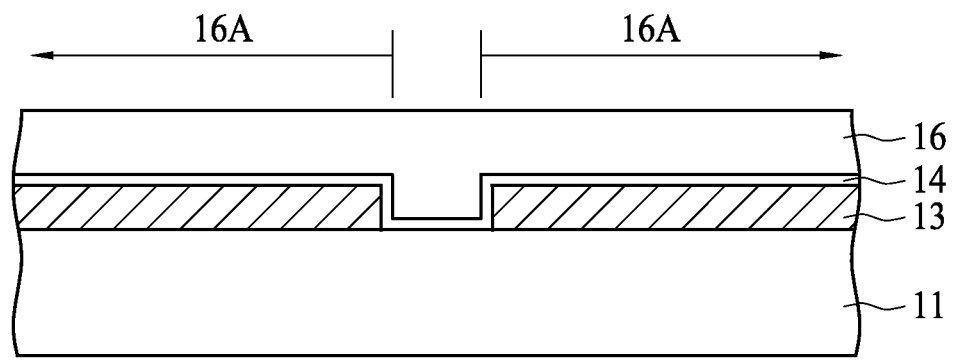
Figure 5:
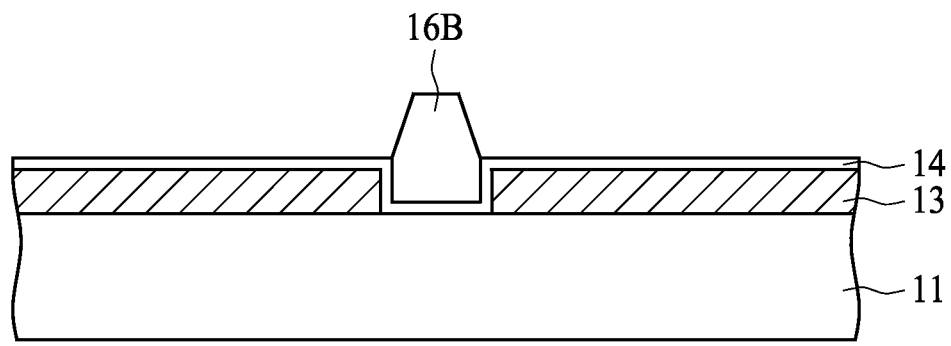

Referring to FIG. 4, a sputtering process is performed to form a seeding layer 14, comprising tungsten-titanium alloy, copper, or nickel-chromium alloy, on the insulation layer 13 and the substrate 11. A photoresist layer 16 is then coated on the seeding layer 14, and an exposure process is then performed on a predetermined portion 16A of the photoresist layer 16. Subsequently, a developing process is performed to remove the predetermined portion 16A so as to form a photoresist pattern 16B, which fills the depression 13A and protrudes the insulation layer 13, as shown in FIG. 5. In one embodiment of the present disclosure, the photoresist pattern 16B has a tapered profile.

Figure 6:
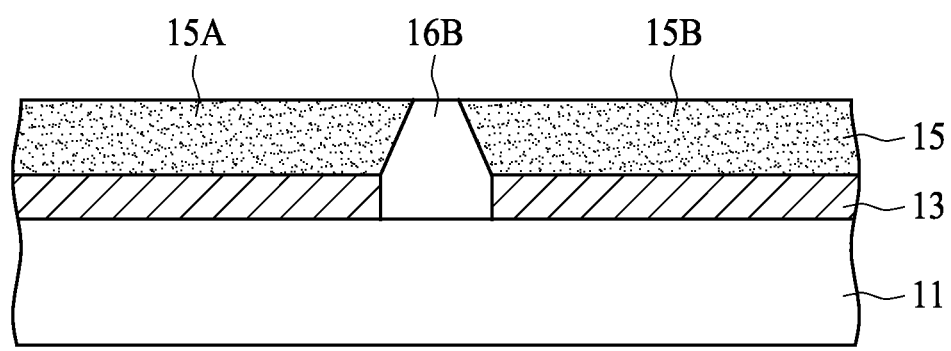
Figure 7:
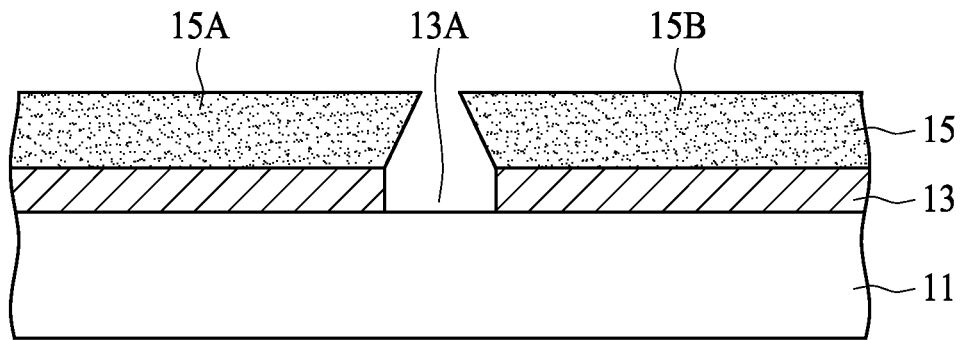

Referring to FIG. 6, an electroplating process is performed to form a conductor layer 15 on the insulation layer 13, and the photoresist pattern 16B separates the conductor layer 15 to form a first electrode 15A and a second electrode 15B. The photoresist pattern 16B is then removed to form a discharge path between the first electrode 15A and the second electrode 15B, and the depression 13A is under the discharge path, as shown in FIG. 7. In FIG. 6 and FIG. 7, the seeding layer 14 is incorporated into the conductor layer 15, and not shown in the drawings. In one embodiment of the present disclosure, because the photoresist pattern 16B has the tapered profile, the first electrode 15A has a first tip, the second electrode 15B has a second tip, and the first tip and the second tip are disposed over the depression 13A.

Figure 8:
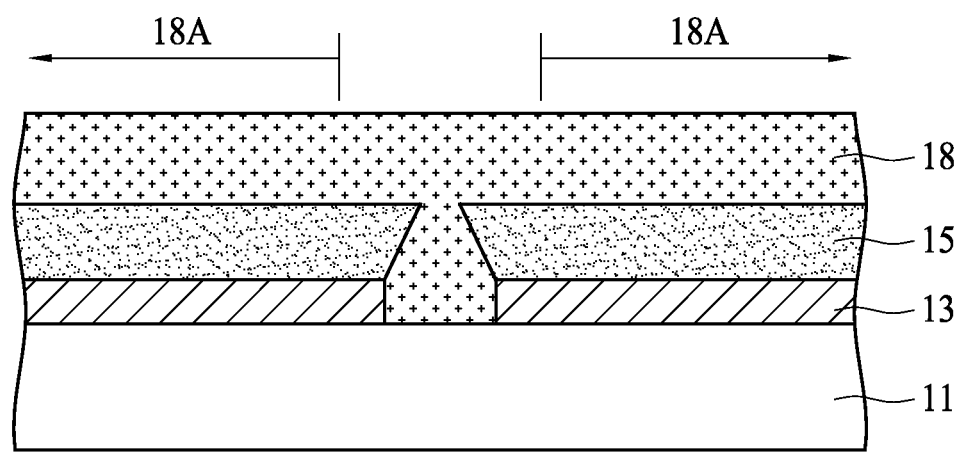
Figure 9:
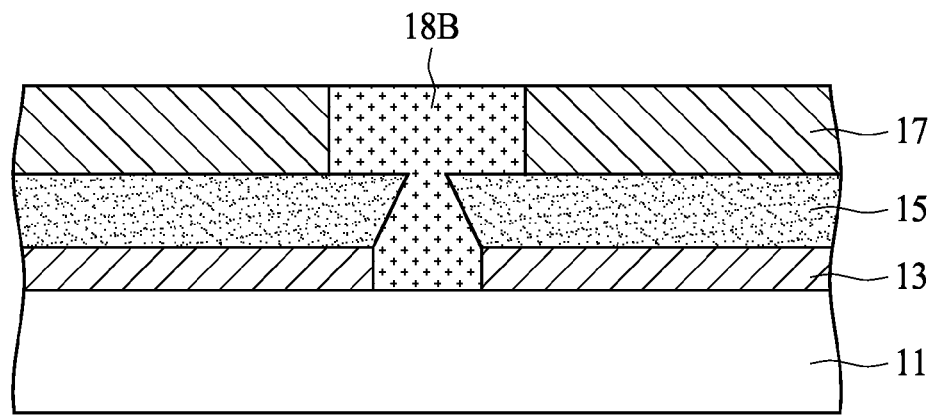

Referring to FIG. 8, a photoresist layer 18 is coated on the conductor layer 15, an exposure process is performed on a predetermined portion 18A of the photoresist layer 18, and a developing process is then performed to remove the predetermined portion 18A so as to form a photoresist pattern 18B. Subsequently, the photoresist pattern 18B is used to form a gasket layer 17 on the conductor layer 15, as shown in FIG. 9. In one embodiment of the present invention, the gasket layer 17 is a conductor layer or an insulation layer, which can be prepared by fabrication processes for preparing the conductor layer 15.

Figure 10:
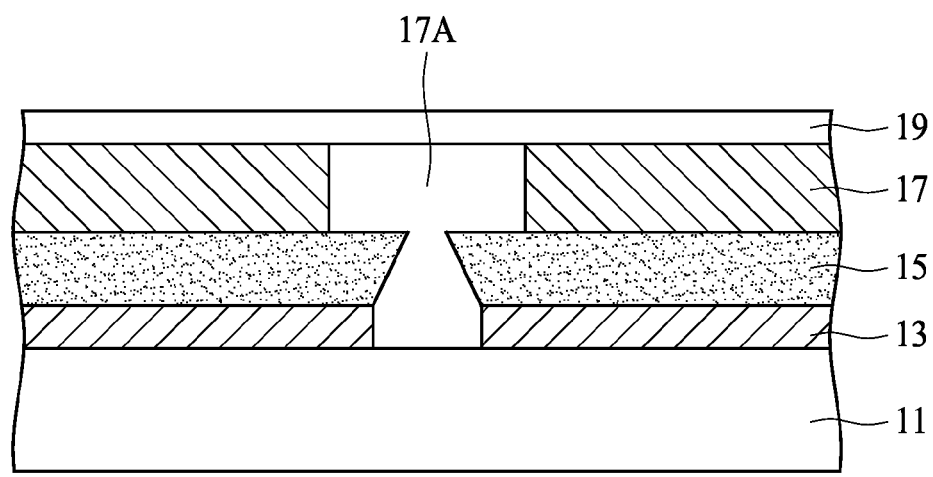

Referring to FIG. 10, the photoresist pattern 18B is removed to form an opening 17A in the gasket layer 17, which exposes at least a portion of the first electrode 15A and the second electrode 15B, and a cross-sectional width of the opening 17A is larger than a cross-sectional width of the depression 13A. Subsequently, a protection layer 19 comprising a dry polyimide film is adhered to the gasket layer 17, and the protection layer 19 shields the opening 17A.

Figure 11:
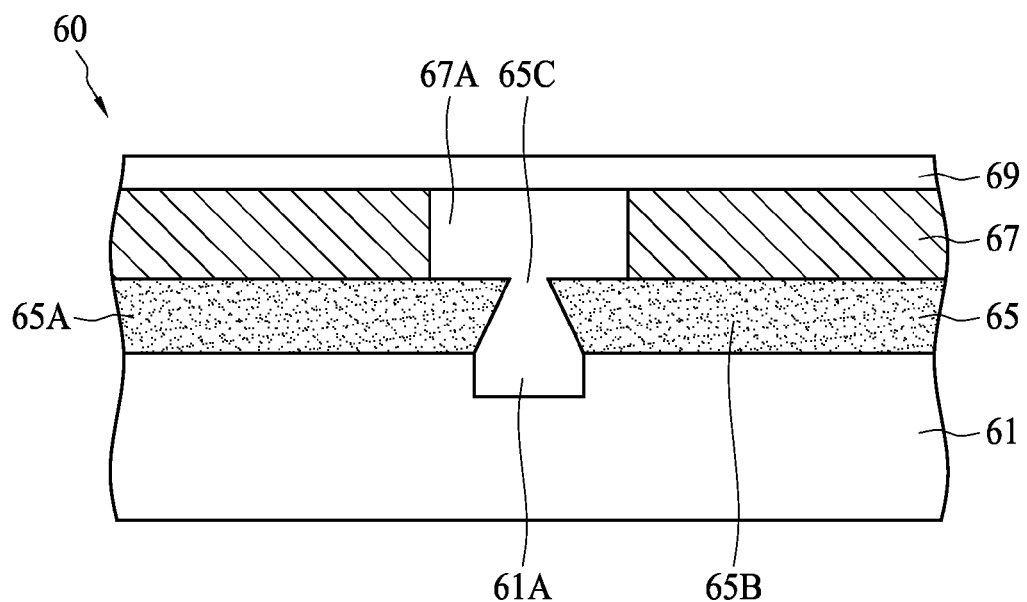
FIG. 11 is a cross-sectional view illustrating an over-voltage protection device according to another embodiment of the present invention.
Figure 12:
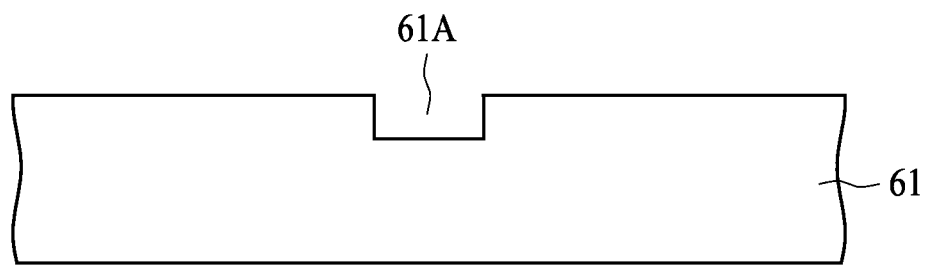
FIG. 12 to FIG. 19 are schematic views illustrating a method for preparing the over-voltage protection device shown in FIG. 11 according to one embodiment of the present invention.

FIG. 11 is a cross-sectional view illustrating an over-voltage protection device 60 according to another embodiment of the present invention. In one embodiment of the present invention, the over-voltage protection device 60 comprises an insulation substrate 61 having a depression 61A, a conductor layer 65 disposed over the insulation substrate 61, a gasket layer 67 disposed over the conductor layer 65, and a protection layer 69 disposed over the gasket layer 67. In the embodiment, the conductor layer 65 has a first electrode 65A and a second electrode 65B, wherein the first electrode 65A and the second electrode 65B form a discharge path 65C, and the depression 61A is under the discharge path 65C; the gasket layer 67 has an opening 67A exposing at least a portion of the first electrode 65A and the second electrode 65B; and the protection layer 69 shields the opening 67A. In one embodiment of the present disclosure, the insulation substrate 61 comprises aluminum oxide or ceramic, the conductor layer 65 comprises copper, the gasket layer 67 comprises epoxy resin or polyimide, and the protection layer 69 comprises epoxy resin or polyimide.

In the embodiment, a cross-sectional width of the opening 67A is larger than a cross-sectional width of the depression 61A; the first electrode 65A has a first tip, the second electrode 65B has a second tip facing the first tip, and the first tip and the second tip are disposed over the depression 61A. Consequently, when a high voltage is applied to the first tip and the second tip, an air discharge, similar to an arc discharge, occurs between the first tip and the second tip, wherein electrode pieces may be generated from the first tip and the second tip by the air discharge. The depression 61A can receive the electrode pieces generated during the air discharge so as to avoid the accumulation of the electrode pieces, which may cause a short circuit between the first tip and the second tip. As a result, the performance of the over-voltage protection device 60 can be ensured.

In one embodiment of the present disclosure, the over-voltage protection device 60 is equipped with the protection layer 69 to isolate the conductor layer 65 from the external environment so as to prevent an external material from falling into the space between the first tip and the second tip, which may cause a short circuit between the first tip and the second tip. In one embodiment of the present disclosure, the gasket layer 67 separates the protection layer 69 from the conductor layer 65; in addition, the opening 67A provides additional space, which allows the first tip and the second tip to conduct the air discharge through the additional space.

FIG. 12 to FIG. 19 are schematic views illustrating a method for preparing the over-voltage protection device 60 shown in FIG. 11 according to one embodiment of the present invention. In one embodiment of the present disclosure, referring to FIG. 12, a depression 61A is formed in an insulation substrate 61 comprising aluminum oxide or ceramic, and the depression 61A can be formed by irradiating an infra-red laser or ultra-violet laser on the insulation substrate 61.

Figure 13:
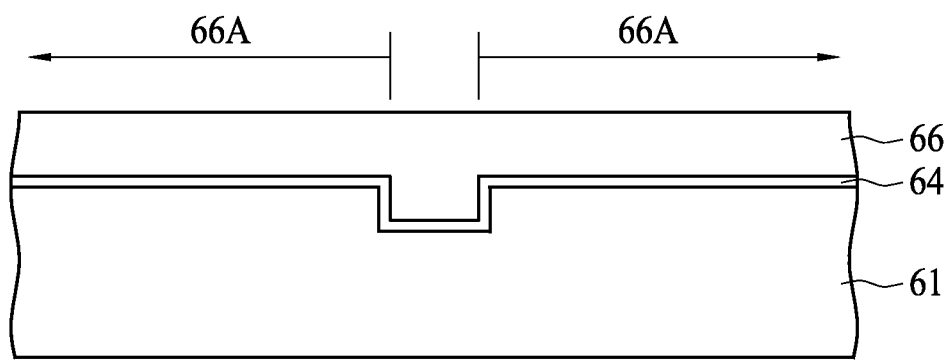
Figure 14:
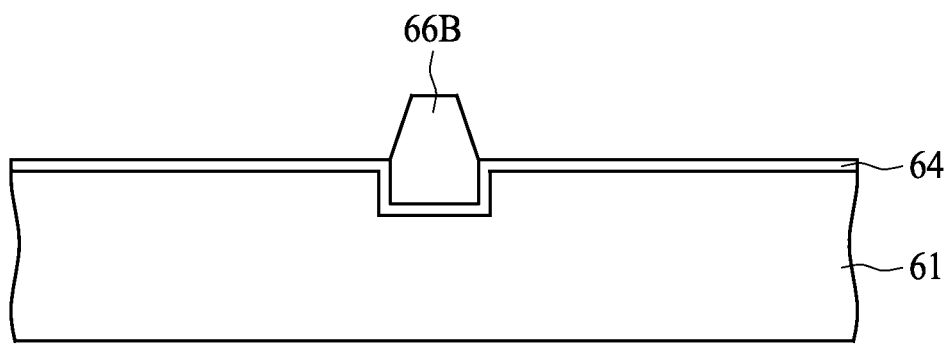

Referring to FIG. 13, a sputtering process is performed to form a seeding layer 64, comprising tungsten-titanium alloy, copper, or nickel-chromium alloy, on the insulation substrate 61. A photoresist layer 66 is then coated on the seeding layer 64, and an exposure process is then performed on a predetermined portion 66A of the photoresist layer 66. Subsequently, a developing process is performed to remove the predetermined portion 66A so as to form a photoresist pattern 66B, which fills the depression 61A and protrudes the insulation substrate 61, as shown in FIG. 14. In one embodiment of the present disclosure, the photoresist pattern 66B has a tapered profile.

Figure 15:
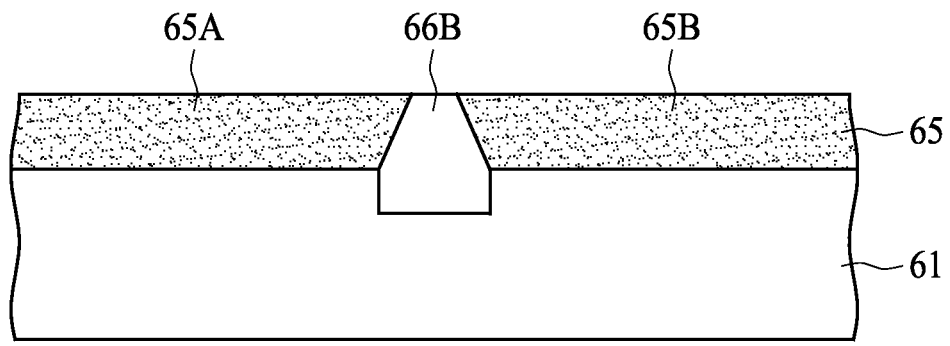
Figure 16:
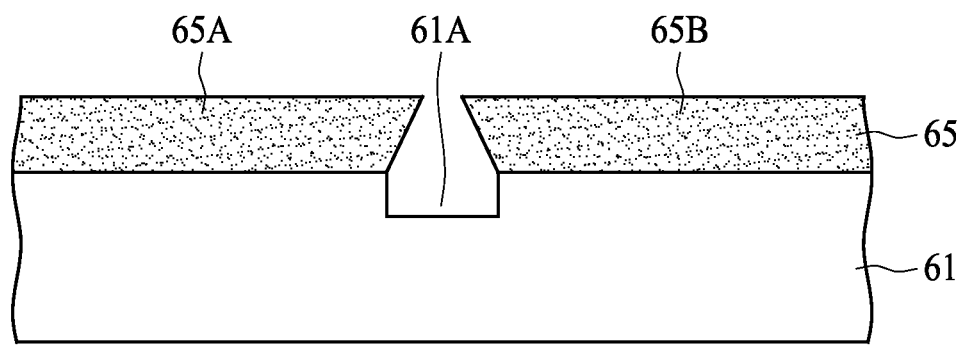

Referring to FIG. 15, an electroplating process is performed to form a conductor layer 65 on the insulation substrate 61, and the photoresist pattern 66B separates the conductor layer 65 to form a first electrode 65A and a second electrode 65B. The photoresist pattern 66B is then removed to form a discharge path between the first electrode 65A and the second electrode 65B, and the depression 61A is under the discharge path, as shown in FIG. 16. In FIG. 15 and FIG. 16, the seeding layer 64 is incorporated into the conductor layer 65, and not shown in the drawings. In one embodiment of the present disclosure, because the photoresist pattern 66B has the tapered profile, the first electrode 65A has a first tip, the second electrode 65B has a second tip, and the first tip and the second tip are disposed over the depression 61A.

Figure 17:
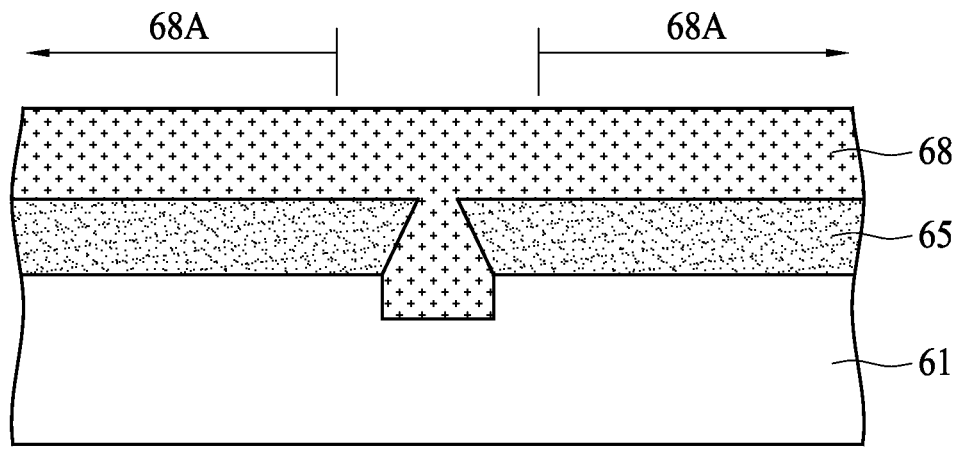
Figure 18:
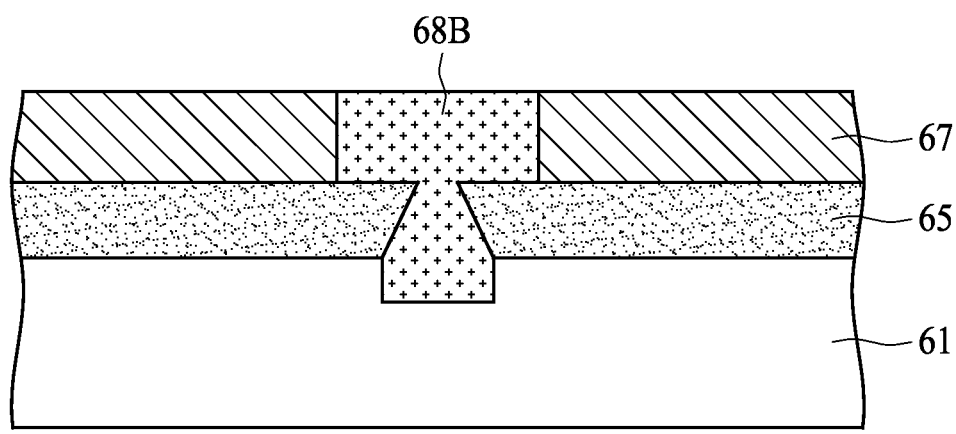

Referring to FIG. 17, a photoresist layer 68 is coated on the conductor layer 65, an exposure process is performed on a predetermined portion 68A of the photoresist layer 68, and a developing process is then performed to remove the predetermined portion 68A so as to form a photoresist pattern 68B. Subsequently, the photoresist pattern 68B is used to form a gasket layer 67 on the conductor layer 65, as shown in FIG. 18. In one embodiment of the present invention, the gasket layer 67 is a conductor layer or an insulation layer, which can be prepared by fabrication processes for preparing the conductor layer 65.

Figure 19:
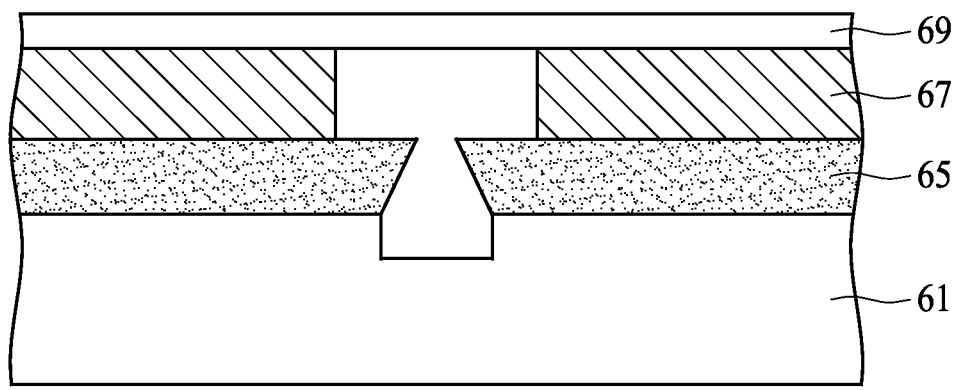

Referring to FIG. 19, the photoresist pattern 68B is removed to form an opening 67A in the gasket layer 67, which exposes at least a portion of the first electrode 65A and the second electrode 65B, and a cross-sectional width of the opening 67A is larger than a cross-sectional width of the depression 61A. Subsequently, a protection layer 69 comprising a dry polyimide film is adhered to the gasket layer 67, and the protection layer 69 shields the opening 67A.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An over-voltage protection device, comprising: a substrate; an insulation layer directly disposed over the substrate, wherein the insulation layer has a depression over the substrate; and a conductor layer disposed over the insulation layer, wherein the conductor layer has a first electrode and a second electrode over the insulation layer, the first electrode and the second electrode form a discharge path, and the depression is under the discharge path and further comprising a gasket layer disposed over the conductor layer, wherein the gasket layer has an opening exposing at least a portion of the first electrode and the second electrode.

2. The over-voltage protection device of claim 1, wherein the substrate comprises aluminum oxide or ceramic, the insulation layer comprises polyimide or epoxy resin, and the conductor layer comprises copper.

3. The over-voltage protection device of claim 1, wherein the gasket layer comprises epoxy resin or polyimide.

4. The over-voltage protection device of claim 1, wherein a cross-sectional width of the opening is larger than a cross-sectional width of the depression.

5. The over-voltage protection device of claim 1, further comprising a protection layer disposed over the gasket layer, wherein the protection layer shields the opening.

6. The over-voltage protection device of claim 5, wherein the protection layer comprises epoxy resin or polyimide.

7. The over-voltage protection device of claim 1, wherein the first electrode has a first tip and the second electrode has a second tip facing the first tip.

8. The over-voltage protection device of claim 7, wherein the first tip and the second tip are disposed over the depression.

9. A method for preparing an over-voltage protection device, comprising steps of: forming an insulation layer directly over a substrate; forming a depression in the insulation layer; forming a photoresist pattern filling the depression and protruding the insulation layer; forming a conductor layer over the insulation substrate, wherein the photoresist pattern separates the conductor layer to form a first electrode and a second electrode; and removing the photoresist pattern to form a discharge path between the first electrode and the second electrode with the depression being under the discharge path, and further comprising steps of: forming a gasket layer over the conductor layer, wherein the gasket layer has an opening exposing at least a portion of the first electrode and the second electrode; and forming a protection layer over the gasket layer, wherein the protection layer shields the opening.

10. The method for preparing an over-voltage protection device of claim 9, wherein a cross-sectional width of the opening is larger than a cross-sectional width of the depression.

11. The method for preparing an over-voltage protection device of claim 9, wherein the photoresist pattern has a tapered profile, the first electrode has a first tip, the second electrode has a second tip, and the first tip and the second tip are disposed over the depression.

* * * * *